(«12») United States Patent
Iwashiro et al.

(10) Patent No.: US 10,761,772 B2
(45) Date of Patent: Sep. 1, 2020

(54) MEMORY SYSTEM INCLUDING A PLURALITY OF CHIPS AND A SELECTIVELY-CONNECTING BUS

(71) Applicant: Toshiba Memory Corporation, Minato-ku (JP)

(72) Inventors: Taro Iwashiro, Yokohama (JP); Takuya Haga, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 276 days.

(21) Appl. No.: 14/644,590

(22) Filed: Mar. 11, 2015

(65) Prior Publication Data

US 2016/0179402 A1    Jun. 23, 2016

Related U.S. Application Data

(60) Provisional application No. 62/094,505, filed on Dec. 19, 2014.

(51) Int. Cl.
*G06F 3/06* (2006.01)
*G11C 16/00* (2006.01)
*G06F 13/16* (2006.01)

(52) U.S. Cl.
CPC ............ *G06F 3/0659* (2013.01); *G06F 3/061* (2013.01); *G06F 3/0679* (2013.01); *G06F 3/0688* (2013.01); *G06F 13/1642* (2013.01); *G11C 16/00* (2013.01)

(58) Field of Classification Search
CPC .... G06F 3/0611; G06F 3/0688; G06F 3/0622; G06F 3/0659
See application file for complete search history.

(56) References Cited

U.S. PATENT DOCUMENTS

2001/0011323 A1\* 8/2001 Ohta ...................... G06F 3/061
                                                711/112
2011/0010512 A1\* 1/2011 Lin ..................... G06F 13/4239
                                                711/158

(Continued)

FOREIGN PATENT DOCUMENTS

JP       2010-282422      12/2010
JP       2012-234363      11/2012

(Continued)

*Primary Examiner* — William B Partridge
*Assistant Examiner* — Eric T Loonan
(74) *Attorney, Agent, or Firm* — Oblon, McClelland, Maier & Neustadt, L.L.P.

(57) ABSTRACT

According to one embodiment, there is provided a memory system including a nonvolatile semiconductor memory, a bus, and a controller. The nonvolatile semiconductor memory includes a first chip and a second chip. The bus is connected to the first chip and the second chip in common. The controller issues a first command to the first chip via the bus. The controller queues a second command whose access destination is identified to be the first chip at a first timing while the first chip is executing the first command. The controller issues to the second chip a third command whose access destination is identified to be the second chip after the first timing, via the bus in priority over the second command, while the first chip is executing the first command or after the execution of the first command finishes.

16 Claims, 9 Drawing Sheets

(56) References Cited

U.S. PATENT DOCUMENTS

| | | | |
|---|---|---|---|
| 2012/0066435 A1* | 3/2012 | Colgrove | G06F 3/061 |
| | | | 711/103 |
| 2012/0079172 A1* | 3/2012 | Yoshida | G06F 12/0607 |
| | | | 711/103 |
| 2012/0278664 A1 | 11/2012 | Kazui et al. | |
| 2014/0351456 A1* | 11/2014 | Sharifie | G06F 3/0613 |
| | | | 710/5 |

FOREIGN PATENT DOCUMENTS

| | | |
|---|---|---|
| JP | 2014-49091 | 3/2014 |
| WO | WO 2014/038223 A1 | 3/2014 |

* cited by examiner

MEMORY SYSTEM INCLUDING A PLURALITY OF CHIPS AND A SELECTIVELY-CONNECTING BUS

CROSS-REFERENCE TO RELATED APPLICATIONS

This application is based upon and claims the benefit of priority from U.S. Provisional Application No. 62/094,505, filed on Dec. 19, 2014; the entire contents of which are incorporated herein by reference.

FIELD

Embodiments described herein relate generally to a memory system.

BACKGROUND

Among memory systems having a nonvolatile semiconductor memory such as a NAND flash memory incorporated therein, there are ones having a plurality of command queues. For these, it is desired to appropriately process commands respectively stored in the plurality of command queues.

DETAILED DESCRIPTION

In general, according to one embodiment, there is provided a memory system including a nonvolatile semiconductor memory, a bus, and a controller. The nonvolatile semiconductor memory includes a first chip and a second chip. The bus is connected to the first chip and the second chip in common. The controller issues a first command to the first chip via the bus. The controller queues a second command whose access destination is identified to be the first chip at a first timing while the first chip is executing the first command. The controller issues to the second chip a third command whose access destination is identified to be the second chip after the first timing, via the bus in priority over the second command, while the first chip is executing the first command or after the execution of the first command finishes.

Exemplary embodiments of a memory system will be explained below in detail with reference to the accompanying drawings. The present invention is not limited to the following embodiments.

First Embodiment

Figure 1:
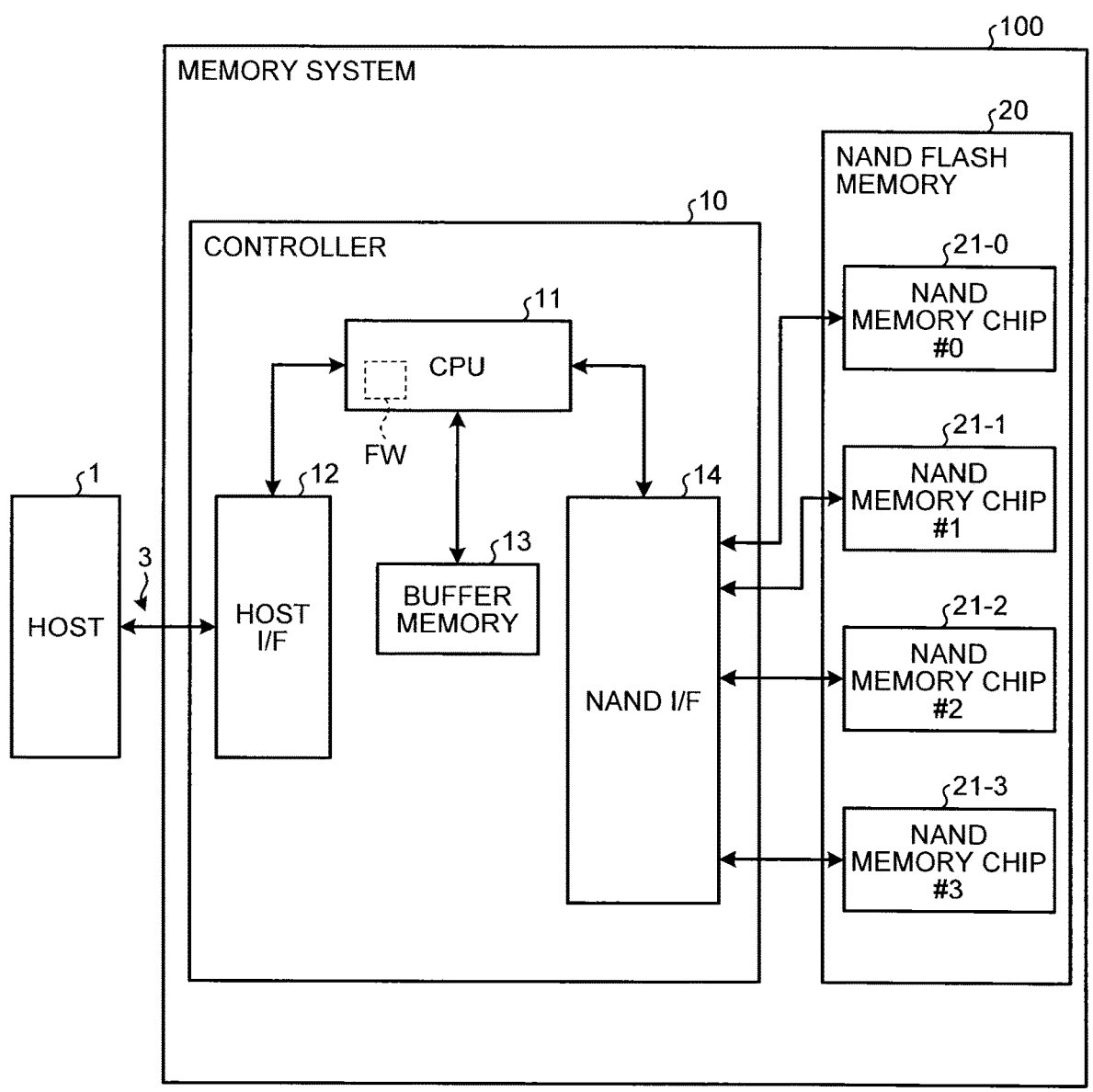
FIG. 1 is a block diagram showing the configuration of a memory system according to a first embodiment.

A memory system 100 according to the first embodiment will be described using FIG. 1. FIG. 1 is a block diagram showing the configuration of the memory system 100. The memory system 100 is connected to a host 1 via a communication path 3 and functions as an external storage device for the host 1. The memory system 100 is, for example, a flash memory for embedded use compliant with UFS (Universal Flash Storage) Standard, eMMC (embedded Multi Media Card) Standard, or the like, or an SSD (Solid State Drive). The host 1 is, for example, a personal computer, a mobile telephone, an imaging device, or the like.

The memory system 100 has a NAND flash memory (nonvolatile semiconductor memory) 20 and a controller 10.

The NAND flash memory 20 stores, for example, management information of the memory system 100 and user data therein. The management information of the memory system 100 includes a logical-physical conversion table (L2P table). The logical-physical conversion table (L2P table) is address conversion information which maps logical addresses (LBA: Logical Block Address) that the host 1 uses when accessing the memory system 100 to physical addresses in the NAND flash memory 20 (each=a block address+a page address+an intra-page storage location).

The NAND flash memory 20 includes multiple NAND memory chips 21-0 to 21-3. The NAND memory chips 21-0 to 21-3 can operate independently of each other. Although FIG. 1 illustrates the case where the NAND flash memory 20 includes four NAND memory chips 21-0 to 21-3, the number of NAND memory chips included in the NAND flash memory 20 may be three or less, or five or greater.

The controller 10 has a CPU (processor) 11, a host interface (host I/F) 12, a buffer memory 13, and a NAND interface (NAND I/F) 14.

The CPU 11 controls the memory system 100 overall. The CPU 11 includes firmware FW and performs control operation according to the firmware FW. For example, the CPU 11 performs control over reading data from the NAND flash memory 20 according to a read request from the host 1.

The buffer memory 13 can be used as a work area of the CPU 11. For example, the CPU 11 reads the logical-physical conversion table (L2P table) from the NAND flash memory 20 to store into the buffer memory 13. For example, the CPU 11 performs logical-physical conversion processing to convert the logical address included in a read request from the host 1 into a physical address using the logical-physical conversion table (L2P table) stored in the buffer memory 13.

Further, the buffer memory 13 can be used as a buffer for storing data. For example, the buffer memory 13 is used as a buffer for storing data read from the NAND memory chips 21. The buffer memory 13 is constituted by, e.g., an SRAM or DRAM, but may be constituted by a register or the like.

The host interface (host I/F) 12 is an interface to connect to the host 1. When receiving a request from the host 1, the host I/F 12 transfers the received request to the CPU 11.

The NAND I/F 14 reads/writes data and management information from/into the NAND flash memory 20 under control of the CPU 11. The details of the NAND I/F 14 will be described later.

The memory system 100 can be a system compliant with the UFS standard. The UFS standard can incorporate a multitask system as a standard feature. Hence, in the memory system 100, the controller 10 may consecutively receive multiple requests (multiple host commands) from the host 1. At this time, the controller 10 needs to process the multiple requests consecutively received from the host 1 efficiently internally to respond to the host 1 quickly. It needs to be considered how efficiently the controller 10 can process the multiple requests so as to reduce the total processing time from when the controller 10 receives the multiple requests until returning the respective responses to the requests to the host 1 rather than concentrating on one request to finish processing it quickly. To this end, the performance of transfer between the controller 10 and the NAND flash memory 20 needs to be improved by efficiently controlling the NAND memory chips 21-0 to 21-3 in the NAND flash memory 20. That is, a technique of efficiently controlling multiple NAND memory chips 21-0 to 21-3 to operate is required for the controller 10.

Figure 2:
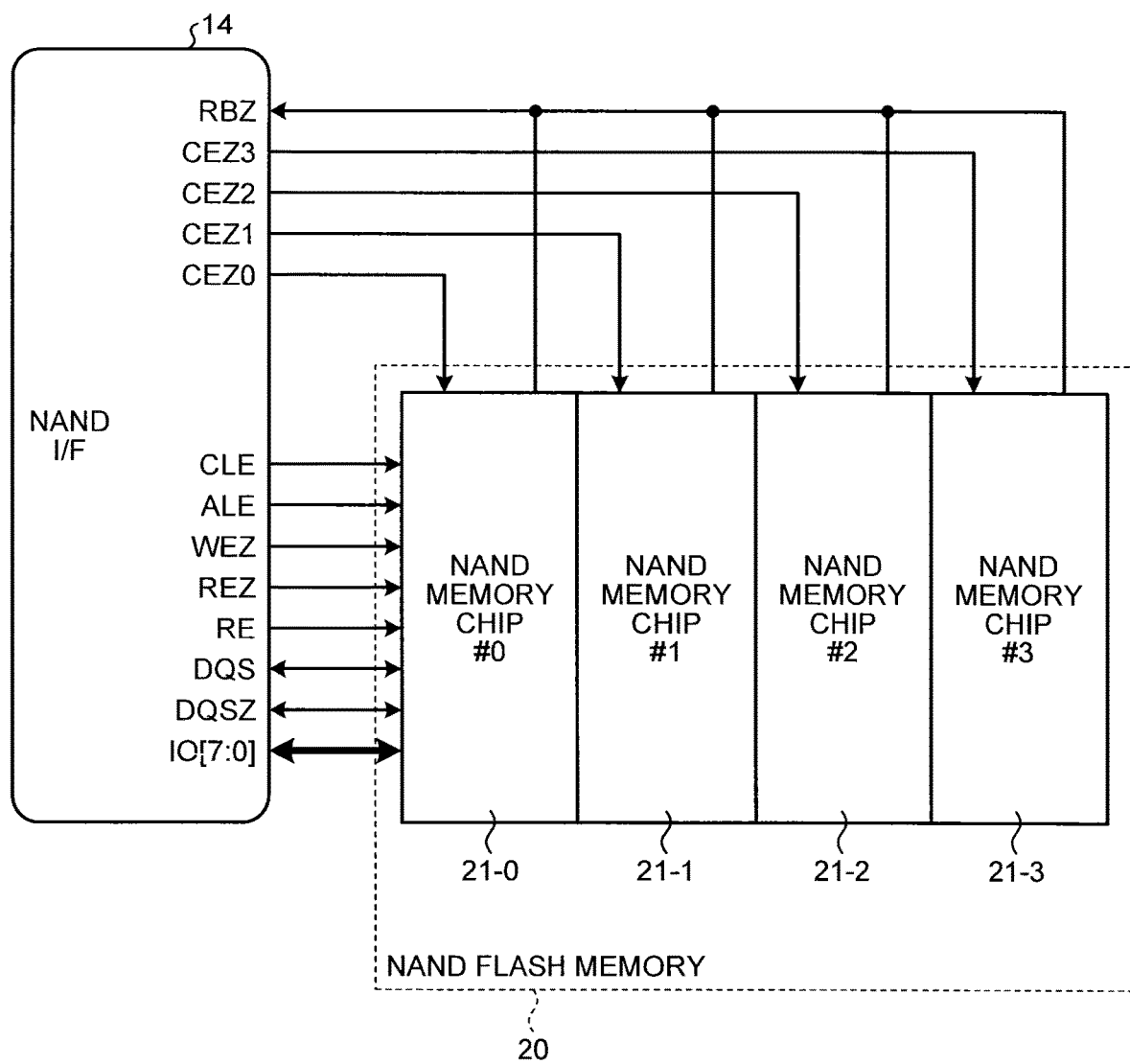
FIG. 2 is a diagram showing the connection configuration of a NAND I/F and a NAND flash memory in the first embodiment.

In the memory system 100, multiple NAND memory chips 21-0 to 21-3 are incorporated for one controller 10. For example, as shown in FIG. 2, the NAND I/F 14 has the NAND memory chips 21-0 to 21-3 share one channel of an IO bus IO[7:0], a DQS line, a DQSZ line, a REZ line, an RE line, a WEZ line, an ALE line, and a CLE line. FIG. 2 is a diagram showing the connection configuration of the NAND I/F 14 and the NAND flash memory 20. The one channel includes the IO bus IO[7:0] and the NAND memory chips 21-0 to 21-3 sharing the IO bus 10[7:0].

Each NAND memory chip 21-0 to 21-3 outputs an Ry/By signal RBZ indicating whether the memory chip is in a busy state or a ready state to the NAND I/F 14. Let RBZ=L indicate being in the busy state and RBZ=H indicate being in the ready state.

Further, the NAND I/F 14 switches a NAND memory chip to be accessed from among the multiple NAND memory chips 21-0 to 21-3 with chip enable signals CEZ0 to CEZ3 (hereinafter referred to as CE0 to CE3). One chip enable signal from among the chip enable signals CE0 to CE3 selectively becomes a low (L) level while the other chip enable signals are kept at a high (H) level, and the NAND I/F 14 can selectively access the NAND memory chip 21 to which the chip enable signal of the L level is supplied.

For example, the NAND I/F 14 transfers a command (and data) to one NAND memory chip 21 selected with the chip enable signal CE0 to CE3 via the one IO bus IO[7:0]. Or the NAND I/F 14 receives data (or a response) transferred from one NAND memory chip 21 selected with the chip enable signal CE0 to CE3 via the one IO bus IO[7:0].

Figure 3:
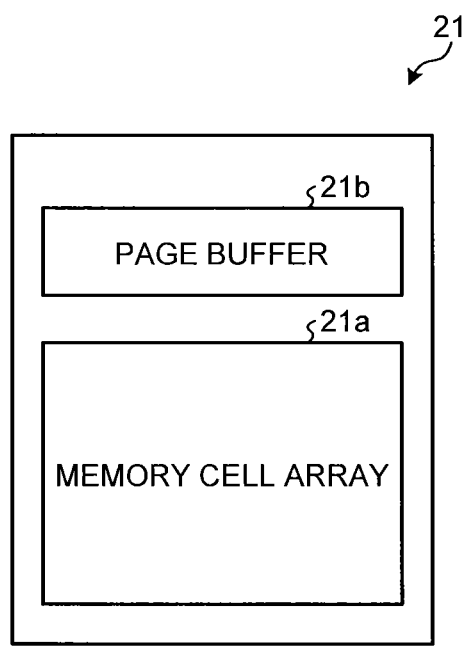
FIG. 3 is a block diagram showing the configuration of a NAND memory chip in the first embodiment.

Next, the internal configuration of each NAND memory chip 21 will be described using FIG. 3. FIG. 3 is a diagram showing the configuration of the NAND memory chip 21.

In the NAND memory chip 21, for example, when receiving the chip enable signal of the L level, a control circuit 21e can accept a command from the NAND I/F 14 and control each part according to the command. When receiving the chip enable signal of the H level, the control circuit 21e does not accept a command from the NAND I/F 14.

The NAND memory chip 21 has a memory cell array 21a and a page buffer 21b. The memory cell array 21a is formed of multiple memory cells arranged in a matrix. Each individual memory cell may be a binary memory (SLC: Single Level Cell) to store one bit per memory cell, or a multivalued memory (MLC: Multi Level Cell) to store two or more bits per memory cell. Each individual memory cell, if being a multivalued memory, can store a multiple value using an upper page and a lower page. The memory cell array 21a comprises multiple physical blocks that are units for erasure, and each individual physical block is configured with multiple physical pages (hereinafter simply referred to as pages) that are units for reading and writing.

The page buffer 21b has, e.g., one page worth of storage capacity. The page buffer 21b is used as a buffer for the NAND memory chip 21 to transmit/receive data to/from the NAND I/F 14. Further, the page buffer 21b is used as a buffer for the NAND memory chip 21 to input/output data to/from the memory cell array 21a.

For example, where a command according to a read request is executed, the NAND memory chip 21 receives a read command (Cmd00h-Adr-Cmd30h) from the NAND I/F 14. Cmd00h and Cmd30h are commands to the NAND memory chip 21. Adr is an address in the NAND memory chip 21 that is the target of the read command. When receiving a read command, the NAND memory chip 21 reads data of interest from the memory cell array 21a into the page buffer 21b. In other words, after receiving a read command, the NAND memory chip 21 can perform internal operation according to the read command without using the one IO bus IO[7:0] (that is, without access from the NAND I/F 14). The NAND memory chip 21 outputs the Ry/By signal RBZ set to indicate the busy state while reading data of interest from the memory cell array 21a into the page buffer 21b. After finishing reading data of interest from the memory cell array 21a into the page buffer 21b, the NAND memory chip 21 switches the Ry/By signal RBZ from the busy state to the ready state. The NAND memory chip 21 transfers the data stored in the page buffer 21b to the NAND I/F 14 via the one IO bus IO[7:0].

Figure 4:
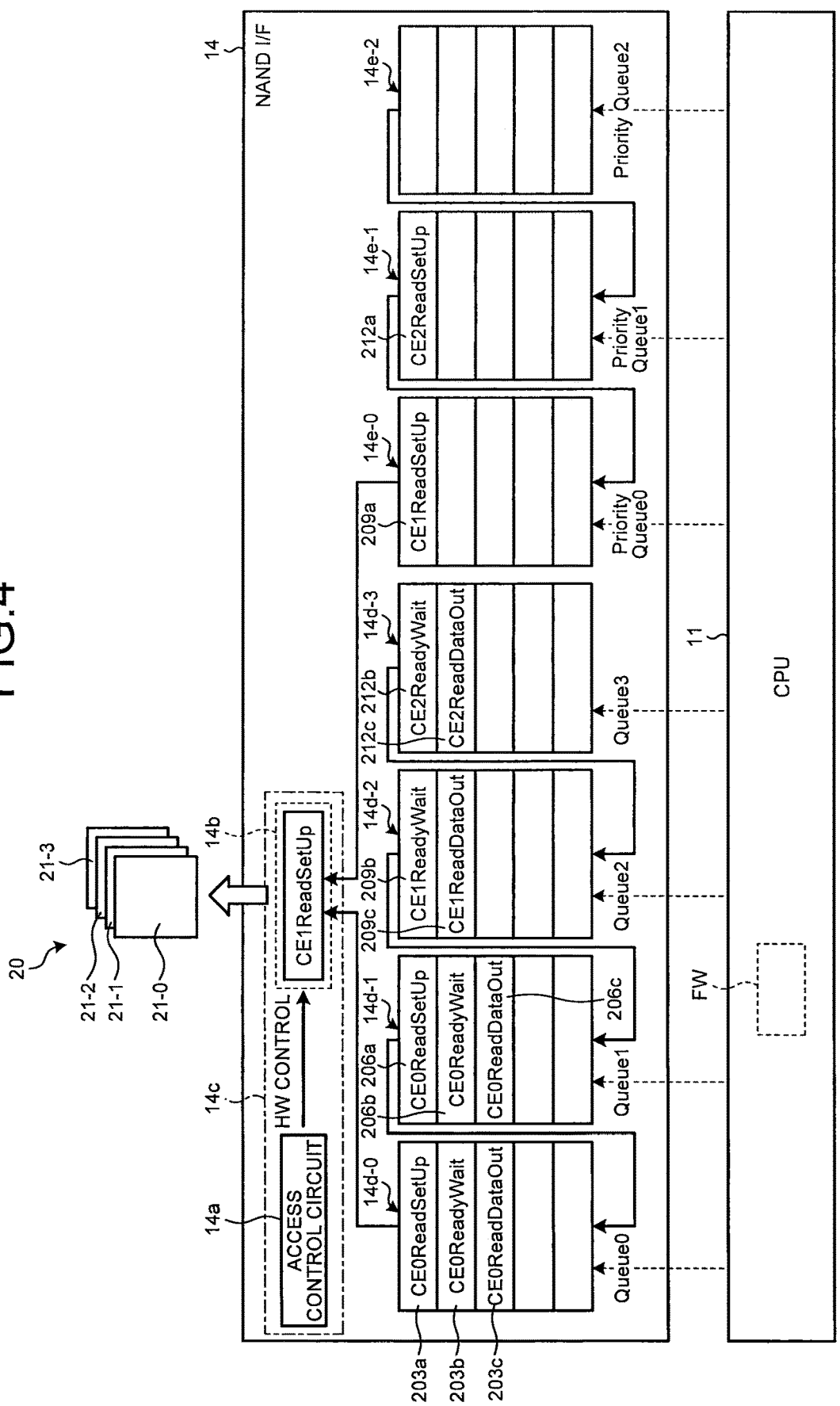
FIG. 4 is a block diagram showing the configuration of the NAND I/F in the first embodiment.
Figure 5:
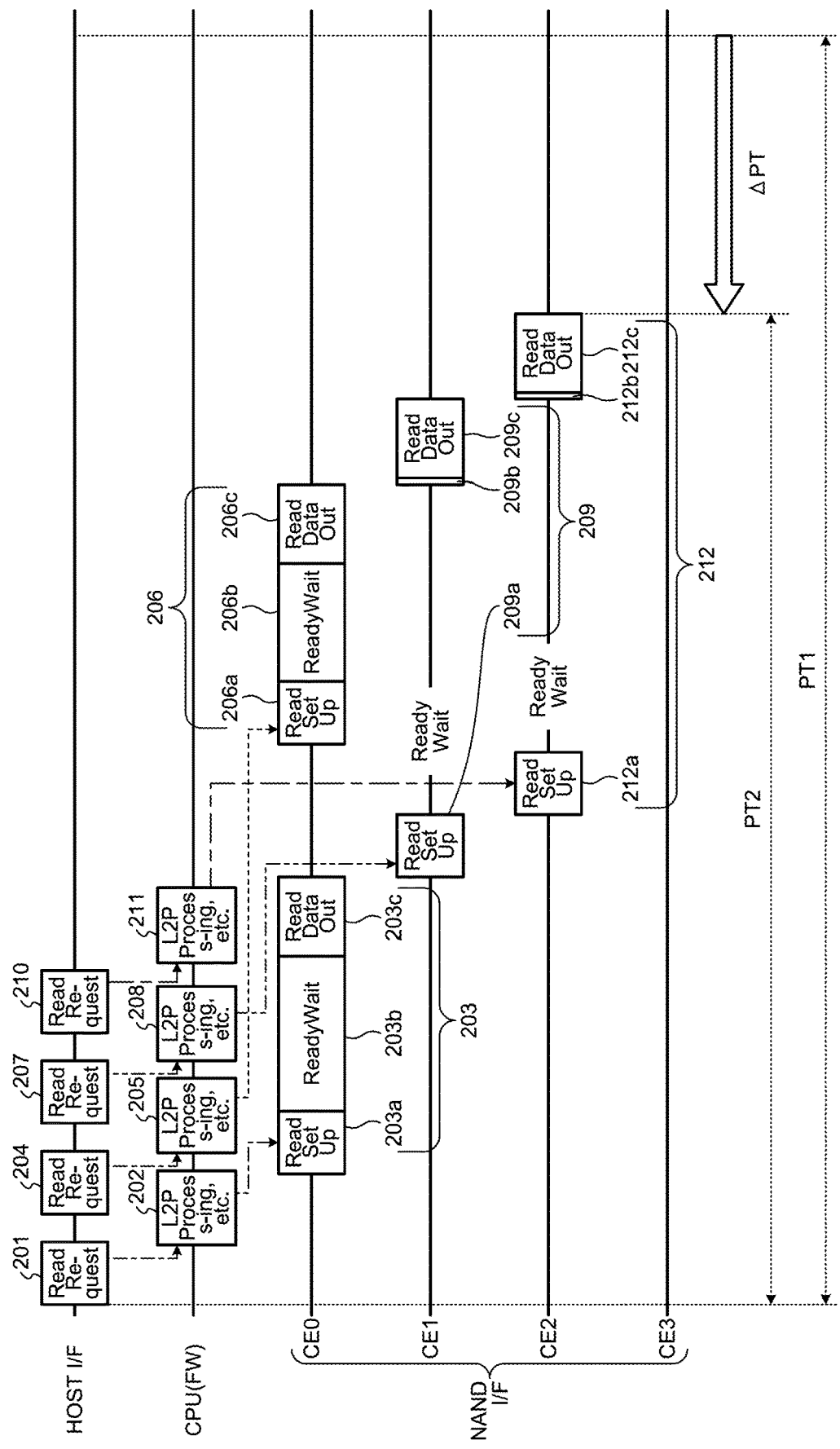
FIG. 5 is a timing chart showing the operation of the memory system according to the first embodiment.

Next, the NAND I/F 14 will be described using FIGS. 4 and 5. FIG. 4 is a diagram showing the configuration of the NAND I/F 14. FIG. 5 is a timing chart showing the operation of the memory system 100.

The NAND I/F 14 has multiple command queues 14d-0 to 14d-3 and a control circuit 14c as shown in FIG. 4. Although FIG. 4 illustrates the case where the NAND I/F 14 has four command queues 14d-0 to 14d-3, the number of command queues 14d that the NAND I/F 14 has may be three or less, or five or greater. Further, although FIG. 4 illustrates the case where the queue depth of each command queue 14d is at five stages, it may be at four or fewer stages or six or more stages.

Each command queue 14d queues commands supplied from the CPU 11 therein. Each command queue 14d is a queue buffer having a FIFO (First In First Out) structure, and the commands are dequeued in the order in which they were queued. Each command queue 14d corresponds to one request, and multiple subcommands into which the one request is divided can be queued therein. Commands queued in the command queue 14d move closer by one to the head each time the command at the head queue is dequeued. The multiple command queues 14d-0 to 14d-3 are connected serially and configured such that the dequeued command is queued into the command queue 14d of the next stage. That is, the command queues 14d-0 to 14d-3 as a whole can function as one command queue.

The CPU 11 realizes which command queue 14d of the command queues 14d-0 to 14d-3 is empty. The CPU 11 divides a request received by the host I/F 12 to create multiple subcommands and queues the created subcommands into an empty command queue 14d.

For example, commands dequeued from the command queue 14d-0 are executed by the control circuit 14c. The control circuit 14c has an access control circuit 14a and an access processing circuit 14b. The access control circuit 14a puts commands dequeued from the command queue 14d into the access processing circuit 14b to make them executable. The access processing circuit 14b executes the inputted command to access the NAND memory chip 21. While the control circuit 14c is executing the command (accessing the NAND memory chip 21), the CPU 11 can queue the next command into an empty command queue 14d. For example, where commands are sequentially queued into the command queues 14d-0 to 14d-3, commands queued in the command queue 14d-0 are put into the access processing circuit 14b, and after the execution thereof finishes, commands queued in the command queue 14d-1 are put into the access processing circuit 14b through the command queue 14d-0 to be executed. After the execution of commands queued in the command queue 14d-1 finishes, commands queued in the command queue 14d-2 are put into the access processing circuit 14b through the command queues 14d-1, 14d-0 to be executed. This processing is sequentially repeated for the execution of commands. Thus, commands can be consecutively executed for the NAND flash memory 20.

For example, as shown in FIG. 5, when read requests 201, 204, 207, 210 are consecutively received and transferred by the host I/F 12 to the CPU 11, the CPU 11 sequentially performs respective preprocessing 202, 205, 208, 211 corresponding to the read requests 201, 204, 207, 210.

For example, the preprocessing 202 corresponding to the read request 201 includes logical-physical conversion processing and division processing. The logical-physical conversion processing converts the logical address included in the read request 201 into a physical address using the logical-physical conversion table (L2P table) stored in the buffer memory 13. The division processing divides the read request 201 to create multiple subcommands 203a to 203c. The multiple subcommands 203a to 203c include access to the NAND memory chip 21-0 and correspond to the chip enable signal CE0. The multiple commands include a read setup (CE0ReadSetUp) command 203a, a ready wait (CE0ReadyWait) command 203b, and a read data out (CE0ReadDataOut) command 203c. The read setup command 203a, ready wait command 203b, and read data out command 203c are ones that should be executed in this order. The read setup command 203a, ready wait command 203b, and read data out command 203c form one read command (first command) 203.

Likewise, the preprocessing 205 corresponding to the read request 204 divides the read request 204 to create multiple subcommands 206a to 206c. The multiple subcommands 206a to 206c include access to the NAND memory chip 21-0 and correspond to the chip enable signal CE0. The multiple subcommands include a read setup (CE0ReadSetUp) command 206a, a ready wait (CE0ReadyWait) command 206b, and a read data out (CE0ReadDataOut) command 206c. The read setup command 206a, ready wait command 206b, and read data out command 206c are ones that should be executed in this order. The read setup command 206a, ready wait command 206b, and read data out command 206c form one read command (second command) 206.

The preprocessing 208 corresponding to the read request 207 divides the read request 207 to create multiple subcommands 209a to 209c. The multiple subcommands 209a to 209c include access to the NAND memory chip 21-1 and correspond to the chip enable signal CE1. The multiple subcommands include a read setup (CE1ReadSetUp) command 209a, a ready wait (CE1ReadyWait) command 209b, and a read data out (CE1ReadDataOut) command 209c. The read setup command 209a, ready wait command 209b, and read data out command 209c are ones that should be executed in this order. The read setup command 209a, ready wait command 209b, and read data out command 209c form one read command 209.

The preprocessing 211 corresponding to the read request 210 divides the read request 210 to create multiple subcommands 212a to 212c. The multiple subcommands 212a to 212c include access to the NAND memory chip 21-2 and correspond to the chip enable signal CE2. The multiple subcommands include a read setup (CE2ReadSetUp) command 212a, a ready wait (CE2ReadyWait) command 212b, and a read data out (CE2ReadDataOut) command 212c. The read setup command 212a, ready wait command 212b, and read data out command 212c are ones that should be executed in this order. The read setup command 212a, ready wait command 212b, and read data out command 212c form one read command 212.

Here, consider the case where the NAND I/F 14 processes the read commands 203, 206, 209, 212 in the order in which the corresponding read requests 201, 204, 207, 210 are received by the host I/F 12. In this case, because the subcommands 203a to 203c are queued in the command queue 14d-0, empty command queues are the command queues 14d-1, 14d-2, 14d-3. The read commands 206 (206a to 206c), 209 (209a to 209c), 212 (212a to 212c), for which the respective preprocessing 205, 208, 211 sequentially finish during the execution of the read command 203, are queued in the empty command queues 14d-1, 14d-2, 14d-3 respectively. Then the control circuit 14c executes the read command 206 after finishing the execution of the read command 203, executes the read command 209 after finishing the execution of the read command 206, and executes the read command 212 after finishing the execution of the read command 209. Thus, as to the multiple read requests 201, 204, 207, 210 consecutively received by the host I/F 12, the time PT1 from when the first read request 201 is received until the execution of the command corresponding to the last read request 201 finishes tends to be elongated.

For example, if the request from the host 1 is a random read request, it is difficult to realize the access destination of the command until the logical-physical conversion processing finishes. During the execution of the read command 203 (during access to the NAND memory chip 21-0), immediately after the preprocessing 208 finishes, the NAND I/F 14 can realize that the access destination of the read command 209 is the NAND memory chip 21-1 (corresponding to the chip enable signal CE1) by referring to the result of the logical-physical conversion processing (such as a physical address). At this time, because of being in an idle state, the NAND memory chip 21-1 can accept a command immediately, but is kept waiting due to the processing order of the command queues 14d, so that the total processing time PT1 of the four read requests 201, 204, 207, 210 is elongated.

Going back to the past, at the time when the first read command 203 is queued into the command queue 14d-0, the logical-physical conversion processing for the subsequent read commands 206, 209, 212 has not finished, so that access destinations in the NAND memory chips 21 are not known, and hence the NAND I/F 14 cannot even wait. Further, because it is unknown when the next host command will come in, the NAND I/F 14 cannot even wait. Although it is a multitask system, requests each in the form of a single command sequentially come in from the host 1, and hence the controller 10 has to process them sequentially, which may not be efficient in processing multiple requests (multiple host commands) consecutively received from the host 1.

Accordingly, in the present embodiment, a priority command queue 14e having priority over the command queues 14d is provided in the NAND I/F 14, and if a command including access to a chip other than the chip currently being accessed is queued into the priority command queue 14e, then that command is executed in priority over commands from the command queues 14d, thereby improving processing efficiency (transfer performance) for multiple requests from the host 1. Hereinafter the command queues 14d are called ordinary command queues 14d in order to distinguish from the priority command queue 14e.

Specifically, as shown in FIG. 4, the NAND I/F 14 further has multiple priority command queues 14e-0 to 14e-2. Although FIG. 4 illustrates the case where the NAND I/F 14 has three priority command queues 14e-0 to 14e-2, the number of priority command queues 14e that the NAND I/F 14 has may be two or less, or four or greater. Further, although FIG. 4 illustrates the case where the queue depth of each priority command queue 14e is at five stages, it may be at four or fewer stages or six or more stages.

Each priority command queue 14e queues commands supplied from the CPU 11 therein. Each priority command queue 14e is a queue buffer having a FIFO (First In First Out) structure, and the commands are dequeued in the order in which they were queued. Each priority command queue 14e corresponds to one request, and some (e.g., the head subcommand) of multiple subcommands into which the one request is divided can be queued therein. Subcommands queued in the priority command queue 14e move closer by one to the head each time the command at the head queue is dequeued. The multiple priority command queues 14e-0 to 14e-2 are connected serially and configured such that the dequeued command is queued into the priority command queue 14e of the next stage. That is, the priority command queues 14e-0 to 14e-2 as a whole can function as one command queue.

The CPU 11 realizes which command queue 14e of the priority command queues 14e-0 to 14e-2 is empty. The CPU 11 divides a request received by the host I/F 12 to create multiple subcommands and determines whether the access destination of the created subcommands is different from that of the command currently being executed. If the access destination of the created subcommands is different from that of the command currently being executed, the CPU 11 queues the head subcommand (read setup command) of those subcommands into an empty priority command queue 14e. At the same time, the CPU 11 queues the second and later subcommands (ready wait command, read data out command) of those subcommands into an empty ordinary command queue 14d.

The access control circuit 14a in the control circuit 14c grants an access right to a command from a selected command queue of the ordinary command queues 14d and the priority command queues 14e. The access right is a right to access the NAND flash memory 20 via the access processing circuit 14b. The access processing circuit 14b executes the command granted an access right and accesses the NAND memory chip 21 specified by the command.

For example, when a command is queued into an ordinary command queue 14d, the control circuit 14c grants an access right to the command from the ordinary command queue 14d and accesses a given NAND memory chip 21 according to the command. While accessing the NAND memory chip 21, when realizing that a command according to a subsequent host command (request from the host 1) has been queued into a priority command queue 14e, the control circuit 14c grants an access right to the command from the priority command queue 14e after finishing the execution of multiple subcommands into which one request was divided (i.e., one read command) and executes the command. The control circuit 14c continues executing until switching ordinary command queues 14d occurs, which time is good to stop.

For example, at the timing when switching from the ordinary command queue 14d-0 to the ordinary command queue 14d-1 occurs, the next access right is passed to the priority command queue 14e, so that the control circuit 14c can execute a command from the priority command queue 14e in priority over others. When finishing executing all commands from the priority command queue 14e, the access right returns to a command from the ordinary command queue 14d. Thereafter, if at least one command is queued into a priority command queue, the control circuit 14c passes the access right to the command from the priority command queue 14e to execute that command.

That is, if a subcommand is queued into a priority command queue 14e during the execution of multiple subcommands (one read command) into which one request was divided and which have been queued in an ordinary command queue 14d, after the execution of the read command finishes, the access control circuit 14a in the control circuit 14c switches from a first state to a second state to have the subcommand in the priority command queue 14e executed. The first state is one where the access right is granted to a command (or subcommand) from the ordinary command queue 14d. The second state is one where the access right is granted to a command (or subcommand) from the priority command queue 14e.

Then, after the execution of the command from the priority command queue 14e, if there is a command queued next in the priority command queue 14e, the access control circuit 14a has that command executed. After the execution of the command in the priority command queue 14e, if there is not another command queued in the priority command queue 14e, the access control circuit 14a returns from the second state to the first state to have the command queued next to the already-executed command in the ordinary command queue 14d executed.

For example, as shown in FIG. 5, when the first read request 201 of multiple read requests to be consecutively received is received by the host I/F 12 and transferred to the CPU 11, the CPU 11 performs the preprocessing 202 such as the logical-physical conversion processing to realize that the NAND memory chip, the access destination, is 21-0 corresponding to the chip enable signal CE0. At the same time, the CPU 11 divides the read request 201 to create multiple subcommands 203a to 203c. The CPU 11 queues the subcommands 203a to 203c into the ordinary command queue 14d-0 (see FIG. 4). The control circuit 14c of the NAND I/F 14 grants the access right to the command queued in the ordinary command queue 14d-0. Accordingly, the control circuit 14c executes the read command 206. For example, the control circuit 14c dequeues the read setup (CE0ReadSetUp) command 203a from the ordinary command queue 14d-0 to execute.

The control circuit 14c selectively makes the chip enable signal CE0 active and accesses the NAND memory chip 21-0 according to the read setup (CE0ReadSetUp) command 203a. The control circuit 14c transfers a read command (Cmd00h-Adr-Cmd30h) to the NAND memory chip 21-0 according to the read setup (CE0ReadSetUp) command 203a. That is, the control circuit 14c issues the read command (Cmd00h-Adr-Cmd30h) to the NAND memory chip 21-0 via the IC bus IO[7:0]. The read command (Cmd00h-

Adr-Cmd30h) instructs the NAND memory chip 21 to perform read processing for, e.g., 4 KB of data.

After finishing the execution of the read setup (CE0ReadSetUp) command 203a, the control circuit 14c dequeues the ready wait (CE0ReadyWait) command 203b from the ordinary command queue 14d-0 to execute. The control circuit 14c waits for the Ry/By signal RBZ from the NAND memory chip 21-0 to switch from the busy state to the ready state according to the ready wait (CE0ReadyWait) command 203b.

When realizing that the Ry/By signal RBZ has switched from the busy state to the ready state, the control circuit 14c finishes the ready wait (CE0ReadyWait) command 203b and dequeues the read data out (CE0ReadDataOut) command 203c from the ordinary command queue 14d-0 to execute. The control circuit 14c reads data from the NAND memory chip 21-0 according to the read data out (CE0ReadDataOut) command 203c and transfers the read data to a read buffer in the buffer memory 13 via the CPU 11. As such, the control circuit 14c issues the read command 203 (the read setup command 203a, ready wait command 203b, read data out command 203c) to the NAND memory chip 21-0 via the IO bus IO[7:0].

In contrast, during the execution of the read command 203, when the next read request 204 from the host 1 is received and transferred by the host I/F 12 to the CPU 11, likewise the CPU 11 performs the preprocessing 205 such as the logical-physical conversion processing to realize that the NAND memory chip, the access destination, is 21-0 corresponding to the chip enable signal CE0. At the same time, the CPU 11 divides the read request 204 to create multiple subcommands 206a to 206c. Because the read command 203 from the ordinary command queue 14d-0 is being executed (the NAND memory chip 21-0 is being accessed), the CPU 11 queues the subcommands 206a to 206c into the ordinary command queue 14d-1 (see FIG. 4).

In addition, when the next read request 207 is received and transferred by the host I/F 12 to the CPU 11, likewise the CPU 11 performs the preprocessing 208 such as the logical-physical conversion processing to realize that the NAND memory chip, the access destination, is the NAND memory chip 21-1 corresponding to the chip enable signal CE1. At the same time, the CPU 11 divides the read request 207 to create multiple subcommands 209a to 209c. Although the read command 203 from the ordinary command queue 14d is being executed (the NAND memory chip 21-0 is being accessed), because the NAND memory chip 21-1 corresponding to the chip enable signal CE1 is in an idle state, the CPU 11 queues the read setup (CE1ReadSetUp) command 209a, the head, of the subcommands 209a to 209c into the priority command queue 14e-0 (see FIG. 4).

Further, when the next read request 210 is received and transferred by the host I/F 12 to the CPU 11, likewise the CPU 11 performs the preprocessing 211 such as the logical-physical conversion processing to realize that the NAND memory chip, the access destination, is the NAND memory chip 21-2 corresponding to the chip enable signal CE2. At the same time, the CPU 11 divides the read request 210 to create multiple subcommands 212a to 212c. Although the subcommands 203a to 203c from the ordinary command queue 14d are being executed (the NAND memory chip 21-0 is being accessed), because the NAND memory chip 21-2 corresponding to the chip enable signal CE2 is in the idle state, the CPU 11 queues the read setup (CE2ReadSetUp) command 212a, the head, of the subcommands 212a to 212c into the priority command queue 14e-1 (see FIG. 4).

As such, the read setup command, the head, of the multiple subcommands into which one request is divided is queued into the priority command queue 14e. By executing the read setup command in advance of the rest to transfer the read command (Cmd00h-Adr-Cmd30h) to the NAND memory chip 21, the control circuit 14c can have the NAND memory chip 21 internally operate according to the read command (Cmd00h-Adr-Cmd30h), without accessing the NAND memory chip 21. By accessing another NAND memory chip 21 during this time, the NAND flash memory 20 can be made to operate efficiently.

When the execution of the subcommands 203a to 203c from the ordinary command queue 14d-0 (i.e., one read command 203) finishes, the control circuit 14c realizes that commands are queued in the priority command queues 14e-0, 14e-1. The control circuit 14c grants the access right to commands from the priority command queue 14e and dequeues the read setup (CE1ReadSetUp) command 209a from the priority command queue 14e-0 to execute. The control circuit 14c selectively makes the chip enable signal CE1 active and accesses the NAND memory chip 21-1 according to the read setup (CE1ReadSetUp) command 209a. The control circuit 14c transfers a read command (Cmd00h-Adr-Cmd30h) to the NAND memory chip 21-1 according to the read setup (CE1ReadSetUp) command 209a. That is, the control circuit 14c issues the read command (Cmd00h-Adr-Cmd30h) to the NAND memory chip 21-1 via the TO bus IO[7:0]. The read command (Cmd00h-Adr-Cmd30h) instructs the NAND memory chip 21 to perform read processing for, e.g., 4 KB of data. As such, the control circuit 14c issues the read setup command 209a to the NAND memory chip 21-1 via the IO bus IO[7:0].

When finishing the execution of the read setup (CE1ReadSetUp) command 209a, the control circuit 14c dequeues the read setup (CE2ReadSetUp) command 212a from the priority command queue 14e-1 via the priority command queue 14e-0 to execute. The control circuit 14c selectively makes the chip enable signal CE2 active and accesses the NAND memory chip 21-2 according to the read setup (CE2ReadSetUp) command 212a. The control circuit 14c transfers a read command (Cmd00h-Adr-Cmd30h) to the NAND memory chip 21-2 according to the read setup (CE2ReadSetUp) command 212a. That is, the control circuit 14c issues the read command (Cmd00h-Adr-Cmd30h) to the NAND memory chip 21-2 via the TO bus IO[7:0]. The read command (Cmd00h-Adr-Cmd30h) instructs the NAND memory chip 21 to perform read processing for, e.g., 4 KB of data. As such, the control circuit 14c issues the read setup command 212a to the NAND memory chip 21-2 via the TO bus IO[7:0].

When finishing the execution of the read setup (CE2ReadSetUp) command 212a, the control circuit 14c gives the access right back to commands from the ordinary command queue 14d and executes the subcommands 206a to 206c queued next to the subcommands 203a to 203c in the ordinary command queue 14d. The control circuit 14c transfers a read command (Cmd00h-Adr-Cmd30h) to the NAND memory chip 21-0 according to the read setup (CE0ReadSetUp) command 206a. That is, the control circuit 14c issues the read command (Cmd00h-Adr-Cmd30h) to the NAND memory chip 21-0 via the IO bus IO[7:0]. Then the control circuit 14c sequentially dequeues the ready wait (CE0ReadyWait) command 206b and read data out (CE0ReadDataOut) command 206c from the ordinary command queue 14d-1 via the ordinary command queue 14d-0 to execute. As such, the control circuit 14c issues the read command 206 (the read setup command 206a, ready wait command 206b, and read data out command 206c) to the NAND memory chip 21-0 via the IO bus IO[7:0].

When finishing the read data out (CE0ReadDataOut) command 206c, the control circuit 14c dequeues the ready wait (CE1ReadyWait) command 209b from the ordinary command queue 14d-2 via the ordinary command queues 14d-1, 14d-0 to execute. At this time, because the read setup (CE1ReadSetUp) command 209a, the head, of the subcommands 209a to 209c was issued in advance, the busy time of the NAND memory chip 21-1 ended during other processing, so that the NAND memory chip 21-1 is ready. When selectively making the chip enable signal CE1 active, the control circuit 14c can realize that the Ry/By signal RBZ from the NAND memory chip 21-0 has switched from the busy state to the ready state and finish the ready wait (CE1ReadyWait) command 209b. The control circuit 14c dequeues the read data out (CE1ReadDataOut) command 209c from the ordinary command queue 14d-2 via the ordinary command queues 14d-1, 14d-0 to execute. The control circuit 14c transfers the transferred data to the read buffer in the buffer memory 13 via the CPU 11 according to the read data out (CE1ReadDataOut) command 209c. As such, the control circuit 14c issues the ready wait command 209b, read data out command 209c to the NAND memory chip 21-0 via the IO bus IO[7:0].

When finishing the read data out (CE1ReadDataOut) command 209c, the control circuit 14c dequeues the ready wait (CE2ReadyWait) command 212b from the ordinary command queue 14d-3 via the ordinary command queues 14d-2, 14d-1, 14d-0 to execute. At this time, because the read setup (CE2ReadSetUp) command 212a, the head, of the subcommands 212a to 212c was issued in advance, the busy time of the NAND memory chip 21-2 ended during other processing, so that the NAND memory chip 21-2 is ready. When selectively making the chip enable signal CE2 active, the control circuit 14c can realize that the Ry/By signal RBZ from the NAND memory chip 21-0 has switched from the busy state to the ready state and finish the ready wait (CE2ReadyWait) command 212b. The control circuit 14c dequeues the read data out (CE2ReadDataOut) command 212c from the ordinary command queue 14d-3 via the ordinary command queues 14d-2, 14d-1, 14d-0 to execute. The control circuit 14c transfers the transferred data to the read buffer in the buffer memory 13 via the CPU 11 according to the read data out (CE2ReadDataOut) command 212c. As such, the control circuit 14c issues the ready wait command 212b, read data out command 212c to the NAND memory chip 21-0 via the IO bus IO[7:0]. Here, processing for the four read requests 201, 204, 207, 210 finishes.

As described above, in the first embodiment, the priority command queues 14e having priority over the ordinary command queues 14d are provided in the NAND I/F 14. If a command including access to a chip other than the chip currently being accessed by a command from a command queue 14d is queued into the priority command queue 14e, then the control circuit 14c executes that command in priority over commands in the ordinary command queues 14d. Thus, a command (or subcommand) subsequent but including access to a NAND memory chip 21 being in the idle state can be executed in priority over others, so that the multiple NAND memory chips can be made to operate efficiently in parallel, thus improving overall transfer performance. Therefore, as compared with the processing time PT1 in the case of processing the read commands 203, 206, 209, 212 in the order in which the corresponding read requests 201, 204, 207, 210 are received, the total processing time PT2 from when the controller 10 receives multiple requests until returning the respective responses to the requests to the host 1 can be shortened by an amount ΔPT.

For example, where requests from the host 1 are random read requests (for a unit of 4 KB), respective read processing according to multiple read requests consecutively received by the host I/F 12 can be efficiently performed for multiple NAND memory chips 21 in parallel. Thus, in the memory system 100, the number of times of read processing for 4 KB of data that can be performed per unit time can be improved. For example, if the number of NAND memory chips incorporated in the memory system 100 is four, the processing time of the controller 10 can be shortened by a factor of ¼ at a maximum, and if the number of NAND memory chips is eight, it can be shortened by a factor of ⅛ at a maximum, so that the overall transfer performance can be improved. In other words, because multiple NAND memory chips can be efficiently accessed, in the memory system 100, the number of times of read processing for 4 KB of data per given time can be greatly improved.

Further, in the first embodiment, if a command is queued into a priority command queue 14e during the execution of multiple subcommands (one read command) into which one request was divided and which have been queued in an ordinary command queue 14d, the control circuit 14c in the NAND I/F 14 executes the command from the priority command queue 14e after finishing the execution of the read command. The control circuit 14c executes the command (subcommand) from the priority command queue 14e in priority over the command queued next in the ordinary command queues 14d after finishing the execution of the read command. Thus, a command (subcommand) subsequent but including access to a NAND memory chip being in the idle state can be executed in priority over others.

Yet further, in the first embodiment, if a command (subcommand) is queued into a priority command queue 14e during the execution of multiple subcommands (one read command) into which one request was divided and which have been queued in an ordinary command queue 14d, after the execution of the read command finishes, the access control circuit 14a in the NAND I/F 14 switches from the first state to the second state to have the command from the priority command queue 14e executed. The first state is one where the access right is granted to a command from the ordinary command queue 14d. The second state is one where the access right is granted to a command from the priority command queue 14e. The access right is a right to access the NAND flash memory 20 via the access processing circuit 14b. As such, command queues to be used can be switched by hardware control by the access control circuit 14a, and hence command queues to be used can be switched at higher speed as compared with the case of switching by the firmware FW.

Although FIGS. 4, 5 show as an example the case where four times of read request are received from the host 1, the number of times of read request consecutively received from the host 1 may be three or less, or five or greater.

Second Embodiment

Next, a memory system 100i according to the second embodiment will be described. Description will be made below focusing on the differences from the first embodiment.

Although in the first embodiment a command from the priority command queue is executed after the execution of multiple subcommands into which one request was divided finishes, in the second embodiment a command from the priority command queue is executed by interrupting a command being executed.

Figure 6:
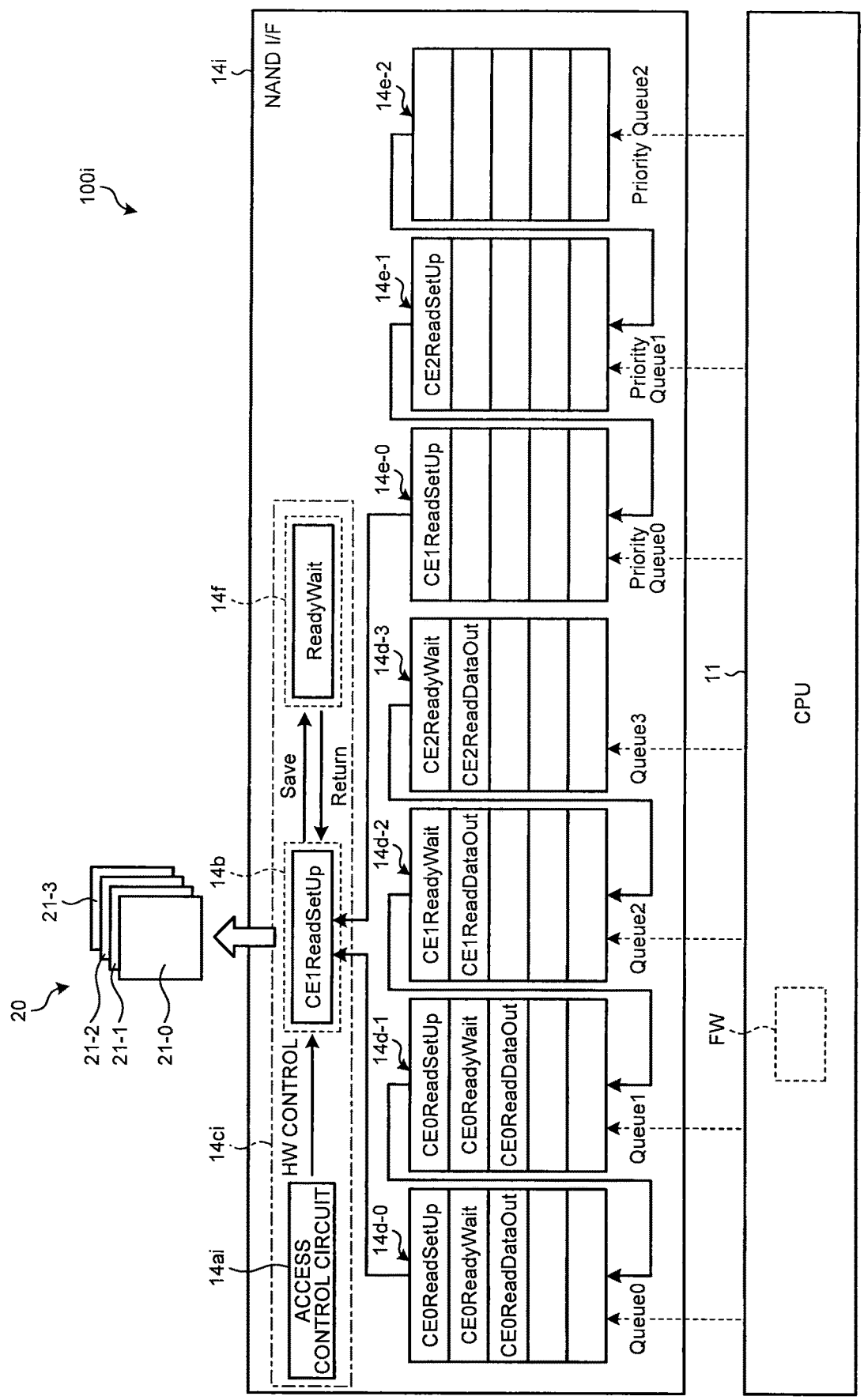
FIG. 6 is a diagram showing the configuration of a NAND I/F in a second embodiment.

Specifically, as shown in FIG. 6, in the memory system 100i, a NAND I/F 14i has a control circuit 14ci instead of the control circuit 14c (see FIG. 4). FIG. 6 is a diagram showing the configuration of the NAND I/F 14i. The control circuit 14ci has an access control circuit 14ai instead of the access control circuit 14a and further has a buffer circuit 14f. The command being executed by the access processing circuit 14b is saved into the buffer circuit 14f.

If a command is queued into a priority command queue 14e during the execution of multiple subcommands (one read command) into which one request was divided and which have been queued in an ordinary command queue 14d, the control circuit 14ci, during the execution of the read command, interrupts to execute the command from the priority command queue 14e. That is, while executing a second or later one of multiple subcommands into which one request was divided, the control circuit 14ci interrupts to execute a subcommand from the priority command queue 14e. After accessing a given NAND memory chip 21 according to the read setup command, the head, of the multiple subcommands, the control circuit 14ci suspends the execution of the second and later subcommands and executes a subcommand (read setup command) from the priority command queue 14e to access another NAND memory chip 21. After accessing the other NAND memory chip 21 according to the subcommand (read setup command) from the priority command queue 14e, the control circuit 14ci resumes the execution of the suspended subcommands unless another subcommand is queued in the priority command queue 14e.

For example, if a command is queued into a priority command queue 14e during the execution of multiple subcommands into which one request was divided and which have been queued in an ordinary command queue 14d, the access control circuit 14ai saves the subcommand being executed into the buffer circuit 14f. At the same time, the access control circuit 14ai switches from the first state to the second state to have the subcommand from the priority command queue 14e executed. The first state is one where the access right is granted to a command (or subcommand) from the ordinary command queue 14d. The second state is one where the access right is granted to a command (or subcommand) from the priority command queue 14e. The access right is a right to access the NAND flash memory 20 via the access processing circuit 14b.

After the execution of the subcommand from the priority command queue 14e, if another subcommand is queued in the priority command queue 14e, then the access control circuit 14ai executes that subcommand. After the execution of the subcommand from the priority command queue 14e, if another subcommand is not queued in the priority command queue 14e, then the access control circuit 14ai returns from the second state to the first state to have the subsequent command (subcommand) queued in the buffer circuit 14f executed.

Figure 7:
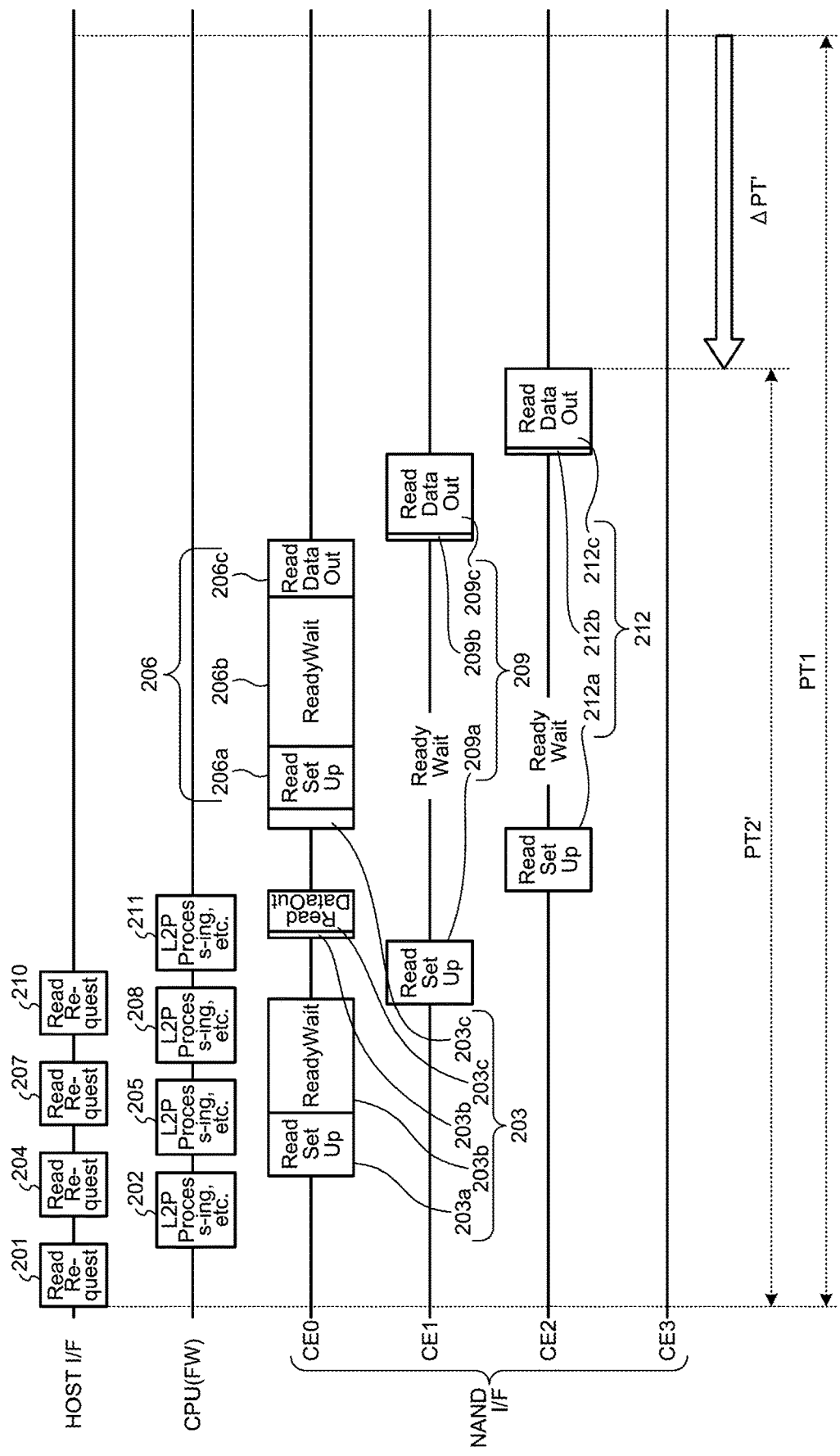
FIG. 7 is a timing chart showing the operation of a memory system according to the second embodiment.

For example, as shown in FIG. 7, the memory system 100i operates differently than in the first embodiment in the following points. FIG. 7 is a timing chart showing the operation of the memory system 100i.

The CPU 11 realizes that the access destination of the subcommands 209a to 209c is the NAND memory chip 21-1 to queue the read setup (CE1ReadSetUp) command 209a, the head subcommand, into the priority command queue 14e-0 (see FIG. 6). Accordingly, the control circuit 14ci saves the ready wait (CE0ReadyWait) command 203b being executed from the access processing circuit 14b into the buffer circuit 14f. Then the control circuit 14ci grants the access right to a subcommand from the priority command queue 14e and dequeues the read setup (CE1ReadSetUp) command 209a from the priority command queue 14e-0 to execute. The control circuit 14ci selectively makes the chip enable signal CE1 active and accesses the NAND memory chip 21-1 according to the read setup (CE1ReadSetUp) command 209a. The control circuit 14ci transfers a read command (Cmd00h-Adr-Cmd30h) to the NAND memory chip 21-1 according to the read setup (CE1ReadSetUp) command 209a. The read command (Cmd00h-Adr-Cmd30h) instructs the NAND memory chip 21 to perform read processing for, e.g., 4 KB of data.

When the execution of the read setup (CE1ReadSetUp) command 209a finishes, the control circuit 14ci returns the access right to commands from the ordinary command queue 14d and returns the ready wait (CE0ReadyWait) command 203b from the buffer circuit 14f to the access processing circuit 14b. The control circuit 14ci resumes the execution of the ready wait (CE0ReadyWait) command 203b. The control circuit 14ci waits for the Ry/By signal RBZ from the NAND memory chip 21-0 to switch from the busy state to the ready state according to the ready wait (CE0ReadyWait) command 203b. When realizing that the Ry/By signal RBZ has switched from the busy state to the ready state, the control circuit 14ci finishes the ready wait (CE0ReadyWait) command 203b and dequeues the read data out (CE0ReadDataOut) command 203c from the ordinary command queue 14d-0 to execute. The control circuit 14ci reads data from the NAND memory chip 21-0 according to the read data out (CE0ReadDataOut) command 203c and transfers the read data to the read buffer in the buffer memory 13 via the CPU 11.

While the control circuit 14ci is transferring data from the NAND memory chip 21-0 to the read buffer, the read setup (CE2ReadSetUp) command 212a is queued into the priority command queue 14e-1 (see FIG. 6). Accordingly, the control circuit 14ci saves the read data out (CE0ReadDataOut) command 203c being executed from the access processing circuit 14b into the buffer circuit 14f. For example, the control circuit 14c makes the chip enable signal CE0 nonactive, so that the NAND memory chip 21-0 can suspend data transfer to the NAND I/F 14I.

Then the control circuit 14ci grants the access right to the command from the priority command queue 14e and dequeues the read setup (CE2ReadSetUp) command 212a from the priority command queue 14e-1 via the priority command queue 14e-0 to execute. The control circuit 14ci selectively makes the chip enable signal CE2 active and accesses the NAND memory chip 21-2 according to the read setup (CE2ReadSetUp) command 212a. The control circuit 14ci transfers a read command (Cmd00h-Adr-Cmd30h) to the NAND memory chip 21-2 according to the read setup (CE2ReadSetUp) command 212a. The read command (Cmd00h-Adr-Cmd30h) instructs the NAND memory chip 21 to perform read processing for, e.g., 4 KB of data.

When the execution of the read setup (CE2ReadSetUp) command 212a finishes, the control circuit 14ci returns the access right to subcommands from the ordinary command queue 14d and returns the read data out (CE0ReadDataOut) command 203c from the buffer circuit 14f to the access processing circuit 14b. The control circuit 14ci resumes the execution of the read data out (CE0ReadDataOut) command 203c. For example, the control circuit 14c makes the chip enable signal CE0 active, so that the NAND memory chip 21-0 can resume data transfer to the NAND I/F 14I. The control circuit 14*ci* transfers the transferred data to the read buffer in the buffer memory 13 via the CPU 11 according to the read data out (CE0ReadDataOut) command 203*c*.

As described above, in the second embodiment, in the NAND I/F 14*i*, if a command (subcommand) is queued into a priority command queue 14*e* during the execution of multiple subcommands (one read command) from the ordinary command queue 14*d*, the control circuit 14*ci*, during the execution of the second or later subcommand of the multiple subcommands, interrupts to execute the subcommand from the priority command queue 14*e*. That is, the control circuit 14*ci* suspends the execution of the second and later subcommands of multiple subcommands from the ordinary command queue 14*d* to execute a subcommand from the priority command queue 14*e* and, after executing the subcommand from the priority command queue 14*e*, resumes the execution of the suspended subcommands. Thus, a command (subcommand) subsequent but including access to a NAND memory chip being in the idle state can be executed in priority over others at a further earlier timing than in the first embodiment. As a result, as compared with the processing time PT1 in the case of processing the read commands 203, 206, 209, 212 in the order in which the corresponding read requests 201, 204, 207, 210 are received, the total processing time PT2' from when the controller 10 receives multiple requests until returning the respective responses to the requests to the host 1 can be further shortened by an amount $\Delta PT'$ ($>\Delta PT$).

Third Embodiment

Next, a memory system 100*j* according to the third embodiment will be described. Description will be made below focusing on the differences from the second embodiment.

Although in the second embodiment ordinary command queues and priority command queues having higher priority over the ordinary command queues are provided in the NAND I/F 14*i*, in the third embodiment, a dedicated command queue is provided for each NAND memory chip.

Figure 8:
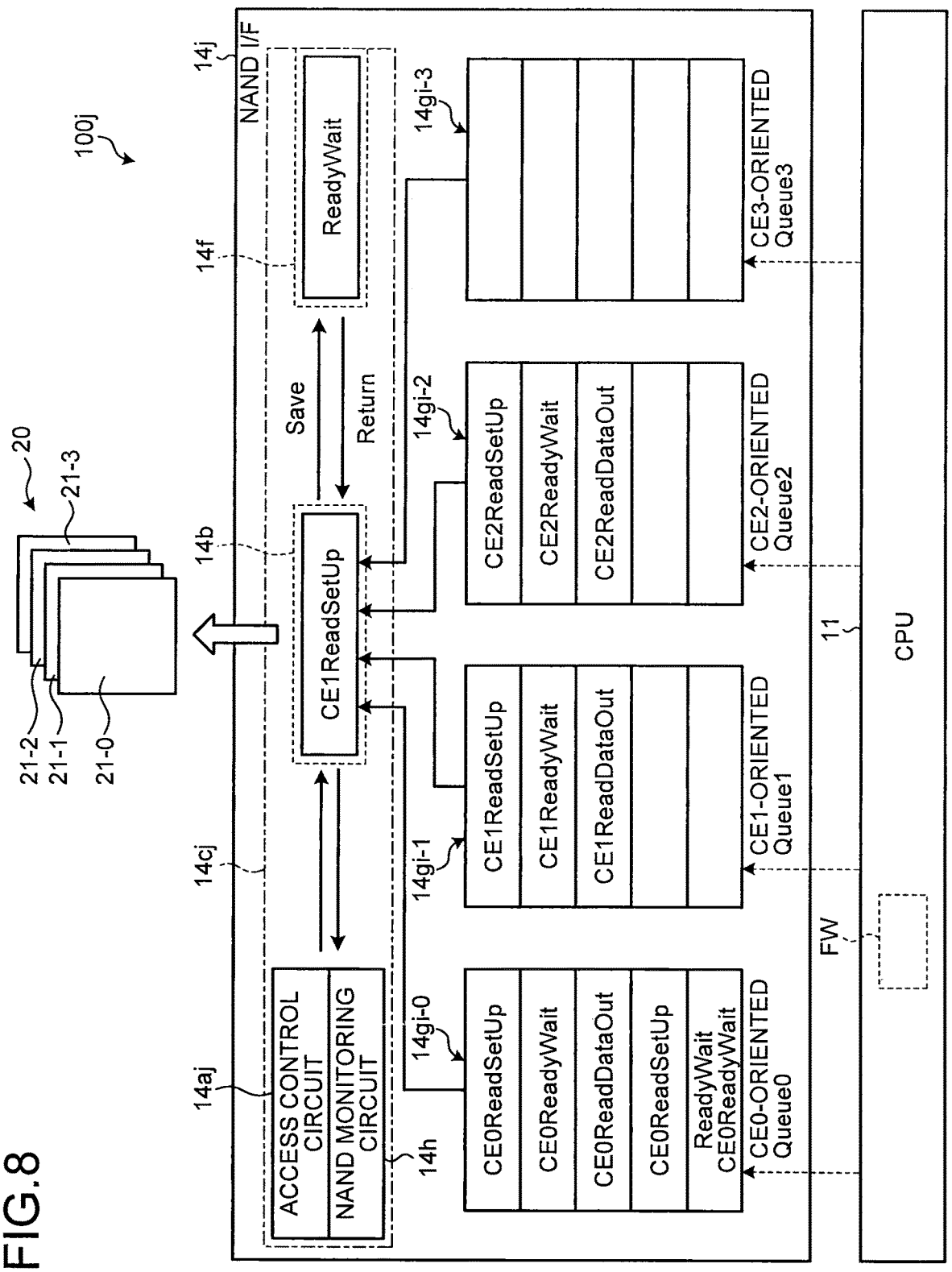
FIG. 8 is a diagram showing the configuration of a NAND I/F in a third embodiment.

Specifically, as shown in FIG. 8, in the memory system 100*j*, a NAND I/F 14*j* has a control circuit 14*cj* instead of the control circuit 14*ci* (see FIG. 6) and multiple chip-oriented command queues 14*gi*-0 to 14*gi*-3 instead of the ordinary command queues 14*d*-0 to 14*d*-3 and the priority command queues 14*e*-0 to 14*e*-2 (see FIG. 6). FIG. 8 is a diagram showing the configuration of the NAND I/F 14*j*. The control circuit 14*cj* has an access control circuit 14*aj* instead of the access control circuit 14*ai* and further has a NAND monitoring circuit 14*h*.

The multiple chip-oriented command queues 14*gi*-0 to 14*gi*-3 correspond to the multiple NAND memory chips 21-0 to 21-3. For example, the chip-oriented command queue 14*gi*-0 corresponds to the NAND memory chip 21-0, and commands whose access destination is the NAND memory chip 21-0 are queued therein.

Each chip-oriented command queue 14*gi* queues commands supplied from the CPU 11 therein. Each command queue 14*d* is a queue buffer having a FIFO (First In First Out) structure, and the commands are dequeued in the order in which they were queued. Commands queued in the chip-oriented command queue 14*gi* move closer by one to the head each time the command at the head queue is dequeued. The multiple command queues 14*d*-0 to 14*d*-3 are each connected to the control circuit 14*cj*, and each dequeued command is put into the control circuit 14*cj*.

The differences from the second embodiment are that the NAND I/F 14*j* has a chip-oriented command queue 14*gi* for each NAND memory chip 21. Thus, the CPU 11 can queue commands (subcommands) into the chip-oriented command queue 14*gi* for each NAND memory chip 21 that is the access destination of them without paying attention to order of priority when queuing commands.

The NAND monitoring circuit 14*h* in the control circuit 14*cj* monitors the respective states of the NAND memory chips 21-0 to 21-3 according to commands (subcommands) executed in the access processing circuit 14*b*. For example, the NAND monitoring circuit 14*h* can monitor a NAND memory chip 21 for which a read setup command is not yet executed or a ready wait command has been executed as being in a ready state (idle state). The NAND monitoring circuit 14*h* can monitor a NAND memory chip 21 for which a read setup command has been executed and the execution of a ready wait command is not yet finished as being in the busy state. The access control circuit 14*aj* grants an access right to a selected command queue of the chip-oriented command queues 14*gi*-0 to 14*gi*-3 according to the monitoring result of the NAND monitoring circuit 14*h*. The access right is a right to access the NAND flash memory 20 via the access processing circuit 14*b*.

The access control circuit 14*aj* starts executing a command from a chip-oriented command queue 14*gi* into which a command was queued first from among the chip-oriented command queues 14*gi*-0 to 14*gi*-3. The NAND monitoring circuit 14*h* monitors the state of each NAND memory chip 21 seeing the command (subcommand) executed for the NAND memory chip 21 to supply the monitoring results to the access control circuit 14*aj*. The access control circuit 14*aj* switches chip-oriented command queues 14*gi* to be used based on the monitoring results of the NAND monitoring circuit 14*h*. Thus, the multiple NAND memory chips 21-0 to 21-3 can be accessed efficiently.

For example, if a command (subcommand) is queued into another chip-oriented command queue 14*gi* during the execution of a command from a given chip-oriented command queues 14*gi*, the access control circuit 14*aj* determines whether to be able to suspend the command being executed to access another NAND memory chip 21. If it can access another NAND memory chip 21 during the execution of the command including access to a given NAND memory chip 21 (e.g., in the case where the subcommand being executed is a ready wait command or a read data out command), the access control circuit 14*aj* temporarily saves the command (subcommand) being executed from the access processing circuit 14*b* into the buffer circuit 14*f*. The access control circuit 14*aj* preferentially grants an access right to the command (subcommand from the other chip-oriented command queue 14*gi*) including access to the other NAND memory chip to have the command executed. When the execution thereof finishes, the access control circuit 14*aj* returns the saved command (subcommand) from the buffer circuit 14*f* to the access processing circuit 14*b* and returns the access right to the command (subcommand) to have it resume being executed.

Note that if a command (subcommand) is queued into another chip-oriented command queue 14*gi* during the execution of a command from a given chip-oriented command queues 14*gi*, the access control circuit 14*aj* may switch chip-oriented command queues 14*gi* to be used on a round robin basis. For example, if there is no order of priority about the access destinations in the NAND memory chips 21-0 to 21-3, by switching chip-oriented command queues 14*gi* on a round robin basis, they can be made to operate such that the order in access is not biased.

Figure 9:
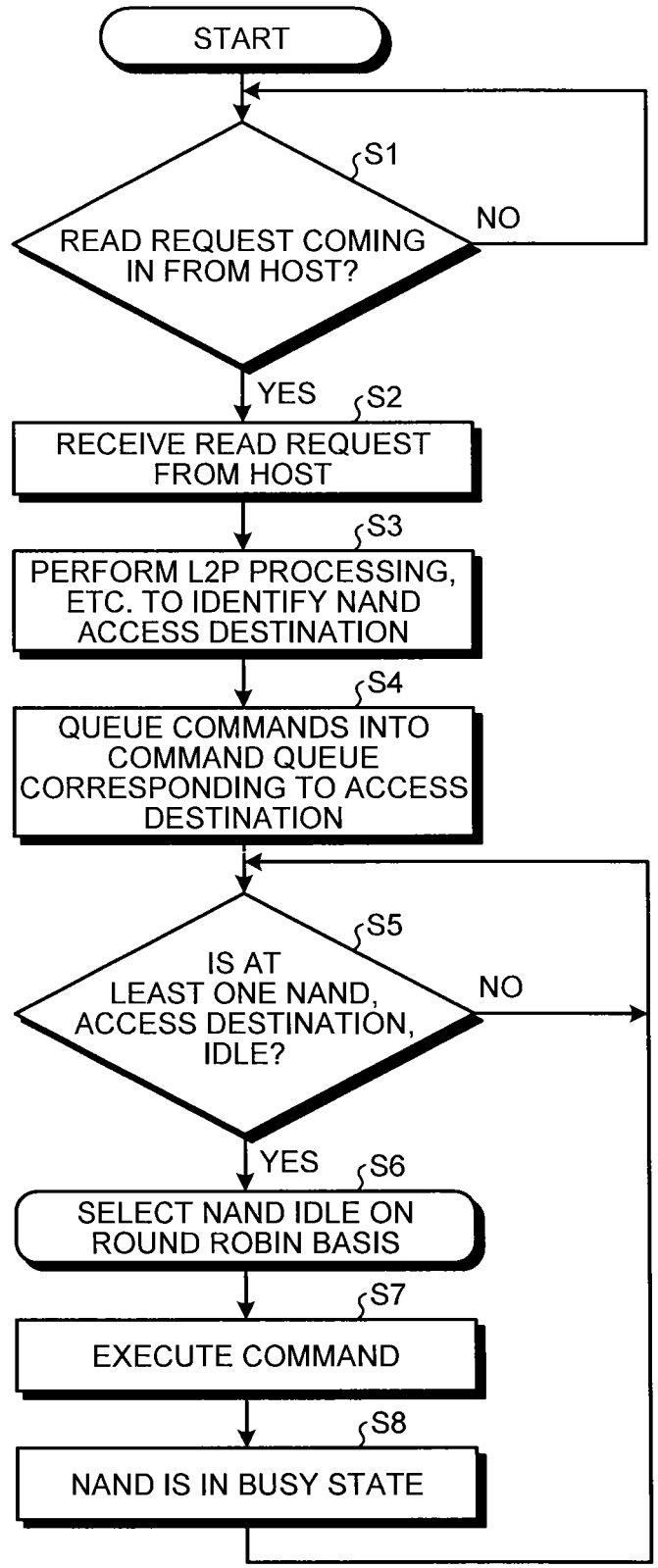
FIG. 9 is a flow chart showing the operation of a memory system according to the third embodiment.

For example, as shown in FIG. 9, the memory system 100*j* can operate differently than in the first embodiment in the following points.

The controller 10 waits until a read request comes in from the host 1 (while No at S1) and, when a read request comes in from the host 1 (Yes at S1), receives the read request by the host I/F 12 (S2). The controller 10 performs preprocessing such as the logical-physical conversion according to the read request. At the same time, the controller 10 divides the read request to create multiple subcommands to identify the NAND memory chip 21 that is the access destination of the multiple subcommands (S3). The controller 10 queues the multiple subcommands created at S3 into the chip-oriented command queue 14*gi* corresponding to the NAND memory chip 21 that is the access destination from among the chip-oriented command queues 14*gi*-0 to 14*gi*-3 (S4).

When commands are queued into one or more chip-oriented command queues 14*gi*, if the subcommand at the head queue of a chip-oriented command queue 14*gi* is one including access to a NAND memory chip 21 (e.g., a read setup command), the controller 10 determines whether the NAND memory chip 21 that is the access destination is in the idle state (ready state) (S5). If none of the NAND memory chips 21 that are the access destinations is in the idle state (No at S5), the controller 10 waits. If the NAND memory chips 21 that are the access destinations of some subcommands are in the idle state (Yes at S5), the controller 10 selects one of the NAND memory chips 21 that are the access destinations on a round robin basis (S6). The controller 10 decides on a command to grant an access right to according to the selected NAND memory chip 21 that is the access destination. The controller 10 dequeues the command granted the access right from the chip-oriented command queue 14*gi* to execute (S7). Thus, the NAND memory chip 21 that is the access destination goes into the busy state (S8). Then the process returns to S5, and the process of S5 to S8 is performed also for the other commands.

As described above, in the third embodiment, a chip-oriented command queue 14*gi* is provided for each NAND memory chip 21 in the NAND I/F 14*j*. If a command is queued into another chip-oriented command queue 14*gi* during the execution of multiple subcommands (one read command) into which one request was divided and which have been queued in a given chip-oriented command queue 14*gi*, the control circuit 14*ci*, during the execution of a second or later one of the multiple subcommands, interrupts to execute the subcommand from the other chip-oriented command queue 14*gi*. Thus, a command (subcommand) subsequent but including access to a NAND memory chip being in the idle state can be executed in priority over others at a further earlier timing than in the first embodiment. As a result, as compared with the processing time PT1 in the case of processing the read commands 203, 206, 209, 212 in the order in which the corresponding read requests 201, 204, 207, 210 are received, the total processing time PT2' from when the controller 10 receives multiple requests until returning the respective responses to the requests to the host 1 can be further shortened by an amount ΔPT' (>ΔPT) (see FIG. 7).

Further, in the third embodiment, since the NAND I/F 14*j* has a chip-oriented command queue 14*gi* for each NAND memory chip 21, the CPU 11 need not consider priority when queuing a command into a chip-oriented command queue 14*gi*. The access control circuit 14*aj* switches chip-oriented command queues 14*gi* to be used based on the monitoring results of the NAND monitoring circuit 14*h*. Thus, the multiple NAND memory chips 21-0 to 21-3 are accessed efficiently. That is, as compared with the case where the CPU 11 controls into which command queue a command (subcommand) is to be queued according to the firmware FW, access to the multiple NAND memory chips 21-0 to 21-3 can be efficiently controlled following the current state better, so that the improvement of the transfer performance can be effectively achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, although in the above embodiments the case where requests from the host 1 are read requests has been described, the present invention can be applied to requests other than read requests such as write requests or erase requests. Further, although in the above embodiments the case where accesses to multiple NAND memory chips are of the same type (a read request) has been described, the present invention can be applied to a combination of different types of accesses such as a combination of write requests and erase requests. For example, a write request is issued to one NAND memory chip, and while the NAND memory chip is operating internally according to the write request, by issuing an erase request to another NAND memory chip, the NAND memory chip can be made to start operating according to the erase request without waiting for the completion of the write request. That is, in dealing with multiple requests from the host 1 during a given time, the processing performance of the controller 10 can be greatly improved, and the processing performance for all commands from the host 1 can be improved.

Although in the above embodiments description has been made taking a NAND flash memory as an example of the nonvolatile semiconductor memory, the nonvolatile semiconductor memory is not limited to a NAND flash memory. Another nonvolatile semiconductor memory such as an MRAM (Magnetoresistive Random Access Memory) may be used.

What is claimed is:

1. A memory system comprising:
   a nonvolatile semiconductor memory including a first chip and a second chip;
   a controller configured to be connectable to a host, the controller including a first command queue and a second command queue, the second command queue having higher priority than the first command queue; and
   a bus configured to be switched to a first connection state or to a second connection state, the first connection state being a state in which the controller is electrically connected to the first chip, the second connection state being a state in which the controller is electrically connected to the second chip,
   wherein the controller is configured to:
      receive, in sequence, a first command and a second command from the host;
      perform, in sequence, a first process corresponding to the first command and a second process corresponding to the second command, the first process being a process in which the controller converts a logical address included in the first command to a physical address and specifies a first destination chip of the first command in accordance with the converted physical address, the second process being a process in which the controller converts a logical address included in the second command to a physical address and specifies a second destination chip of the second command in accordance with the converted physical address;

divide the first command into a set of first sub-commands, each of the first sub-commands in the set of first sub-commands being associated with the first destination chip which is specified for the first command in the first process;

divide the second command into a set of second sub-commands each of the second sub-commands in the set of second sub-commands being associated with the second destination chip which is specified for the second command in the second process;

execute one of the first sub-commands divided from the first command in the first process;

compare the second destination chip of the second sub-commands specified in the second process and the first destination chip of the currently executed first sub-command;

when the second destination chip specified in the second process is same as the first destination chip of the currently executed first sub-command queue each of the second sub-commands in the set of second sub-commands into the first command queue that is empty; and when the second destination chip specified in the second process is different from the first destination chip of the currently executed first sub-command, queue a head second sub-command in the set of second sub-commands into the second command queue that is empty, and queue other second sub-commands than the head second sub-command in the set of second sub-commands into the first command queue that is empty.

2. The memory system according to claim 1, wherein the controller further includes:

an access processing circuit configured to execute a sub-command to access the nonvolatile semiconductor memory; and an access control circuit configured to grant a right to access the nonvolatile semiconductor memory via the access processing circuit to a sub-command from a selected one of the first command queue and the second command queue.

3. The memory system according to claim 2, wherein, when a sub-command associated with the first chip is to be dequeued from the first command queue or the second command queue, the access processing circuit switches the bus to the first connection state to access via the bus the first chip, and when a sub-command associated with the second chip is to be dequeued from the first command queue or the second command queue, the access processing circuit switches the bus to the second connection state to access via the bus the second chip.

4. The memory system according to claim 3, wherein the access processing circuit is configured to switch the bus to the first connection state by activating a first chip enable signal, and the access processing circuit is configured to switch the bus to the second connection state by activating a second chip enable signal.

5. The memory system according to claim 2, wherein, when the second command queue stores no sub-command, the access control circuit switches to a first access state in which the access control circuit grants the access right to a sub-command dequeued from the first command queue, when the second command queue stores a sub-command, the access control circuit switches to a second access state in which the access control circuit grants the access right to the sub-command dequeued from the second command queue.

6. The memory system according to claim 5, wherein, when a sub-command is queued into the second command queue during an execution of a set of sub-commands dequeued from the first command queue, the access control circuit continues to be in the first access state, and after the execution of the set of sub-commands is complete, the access control circuit switches from the first access state to the second access state to execute the sub-command dequeued from the second command queue.

7. The memory system according to claim 6, wherein the set of sub-commands are divided from one command.

8. The memory system according to claim 5, wherein, when a sub-command is queued into the second command queue during an execution of a set of sub-commands dequeued from the first command queue, the access control circuit switches from the first access state to the second access state to interrupt the execution of the set of sub-commands and to execute the sub-command dequeued from the second command queue.

9. The memory system according to claim 8, wherein, after an execution of a sub-command among the set of sub-commands is complete, the access control circuit suspends an execution of a next sub-command among the set of sub-commands to execute the sub-command dequeued from the second command queue.

10. The memory system according to claim 9, wherein, after the execution of the sub-command dequeued from the second command queue is complete the access control circuit resumes the execution of the next sub-command among the set of sub-commands.

11. The memory system according to claim 8, wherein, after the execution of the sub-command dequeued from the second command queue is complete, the access control circuit returns from the second access state to the first access state to resume the execution of the set of sub-commands.

12. The memory system according to claim 2, wherein, in the first access state, when the sub-command associated with the first chip is to be dequeued from the first command queue, the access processing circuit switches the bus to the first connection state to execute the sub-command to access via the bus the first chip, in the first access state, when the sub-command associated with the second chip is to be dequeued from the first command queue, the access processing circuit switches the bus to the second connection state to execute the sub-command to access via the bus the second chip, in the second access state, when the sub-command associated with the first chip is to be dequeued from the second command queue, the access processing circuit switches the bus to the first connection state to execute the sub-command to access via the bus the first chip, and in the second access state, when the sub-command associated with the second chip is to be dequeued from the second command queue, the access processing circuit switches the bus to the second connection state to execute the sub-command to access via the bus the second chip.

13. The memory system according to claim 2, wherein the controller further includes:

a buffer circuit for saving a sub-command.

14. The memory system according to claim 13, wherein, when a sub-command is queued into the second command queue during an execution of a set of sub-commands dequeued from the first command queue, after an execution of a sub-command among the set of sub-commands is complete, the access control circuit saves a next sub-command among the set of sub-commands into the buffer circuit and switches from a first access state to a second access state, the first access state being a state in which the access control circuit grants the access right to a sub-command dequeued from the first command queue, the second access state being a state in which the access control circuit grants the access right to a sub-command dequeued from the second command queue.

15. The memory system according to claim 14, wherein, after the execution of the sub-command dequeued from the second command queue is complete, the access control circuit returns from the second access state to the first access state and returns the saved next sub-command from the buffer circuit to the access control circuit to resume the execution of the set of sub-commands.

16. The memory system according to claim 15, wherein the first command queue includes multiple first sub-queues, the multiple first sub-queues being connected serially, and the second command queue includes multiple second sub-queues, the multiple second sub-queues being connected serially, when the first destination chip specified in the first process is same as the second destination chip specified in the second process, the controller queues each of the second sub-commands in the set of second sub-commands into an empty first sub-queue among the multiple first sub-queues, and when the first destination chip specified in the first process is different from the second destination chip specified in the second process, the controller queues a head second sub-command in the set of second sub-commands into an empty second sub-queue among the multiple second sub-queues, and queues other second sub-commands than the head second sub-command in the set of second sub-commands into an empty first sub-queue among the multiple first sub-queues.

\* \* \* \* \*